United States Patent [19]

Kanbara et al.

[11] Patent Number: 4,575,925

[45] Date of Patent: Mar. 18, 1986

[54] METHOD FOR FABRICATING A SOI TYPE SEMICONDUCTOR DEVICE

[75] Inventors: Kazuhiro Kanbara, Kawasaki; Osamu Hataishi, Yokohama, both of Japan

[73] Assignee: Fujitsu Limited, Kawasaki, Japan

[21] Appl. No.: 675,613

[22] Filed: Nov. 28, 1984

[30] Foreign Application Priority Data

Nov. 30, 1983 [JP] Japan ................................ 58-225654
Nov. 30, 1983 [JP] Japan ................................ 58-225657

[51] Int. Cl.[4] .................... H01L 21/324; H01L 21/36
[52] U.S. Cl. .................... 29/576 W; 29/578;
29/576 E; 29/576 T; 148/15; 148/175;
148/DIG. 50; 148/188; 357/49
[58] Field of Search ............. 29/576 T, 576 E, 578,
29/576 W, 580; 148/1.5, 175, 188, DIG. 50, 31,
90, 93; 156/649; 357/49

[56] References Cited

U.S. PATENT DOCUMENTS

| 3,433,686 | 3/1969 | Marinace | 29/576 W |
|---|---|---|---|
| 3,912,555 | 10/1975 | Tsuguki | 29/576 W |
| 4,224,636 | 9/1980 | Yonezawa et al. | 357/49 |
| 4,255,209 | 3/1981 | Morcom et al. | 357/49 |
| 4,400,411 | 8/1983 | Yuan et al. | 148/175 |
| 4,404,738 | 9/1983 | Sasaki et al. | 148/175 |
| 4,463,493 | 8/1984 | Momose | 29/576 W |
| 4,507,158 | 3/1985 | Kamins et al. | 29/576 T |

*Primary Examiner*—Brian E. Hearn
*Assistant Examiner*—Hunter L. Auyang
*Attorney, Agent, or Firm*—Staas & Halsey

[57] ABSTRACT

A method for fabricating a connection to a deep buried layer of a bipolar transistor based on SOI technology. In such a method, an epitaxial layer is grown on a single crystalline island formed by recrystallizing a polycrystalline layer on an insulating layer. Then the side surface(s) of the epitaxial layer is tentatively exposed and a conduction path along the side surface(s) is formed extending from the upper surface of the epitaxial layer to the single crystalline island thereunder.

28 Claims, 20 Drawing Figures

METHOD FOR FABRICATING A SOI TYPE SEMICONDUCTOR DEVICE

BACKGROUND OF THE INVENTION

The present invention relates to a method for fabricating a SOI (Semiconductor on Insulator) type semiconductor device, and more precisely, relates to a method for forming a connection to a buried layer of a semiconductor device fabricated by SOI technology.

In SOI technology, a number of semiconductor single crystalline layers having the width and length in the order of from a few tens to hundreds of microns, for example, are formed on an insulating layer and then a functional device, such as a transistor or diode, is fabricated in each of the single crystalline layers. SOI technology is expected as a breakthrough in future LSI (large scale integration) circuits for the existing speed and packing density limitations. That is, since each of the semiconductor single crystalline layers is usually formed so as to be embedded in an insulating matrix having a depth of a few tens of a micron, the transistor or diode fabricated in each single crystalline layer is dielectrically isolated from the others and also from the substrate, such as silicon; therefore, the semiconductor device has low stray capacity and high breakdown voltage characteristics.

The single crystalline layers are originally formed by recrystallizing a polycrystalline layer, such as a polysolicon layer, which has a thickness in the order of microns, and which is deposited on an insulating layer, such as a silicon dioxide layer. The polycrystalline layer is passivated except the regions at which the final single crystalline layer is formed. The regions are also referred to as "device regions" hereinafter. There are various cases wherein the passivation is performed prior to or after the recrystallization, and the recrystallization is performed entirely or partially of the polycrystalline layer. Thus, the islands of single crystalline layers floating in an insulating matrix are obtained. An epitaxial layer is then formed on each of the recrystallized layers by using an ordinary epitaxial growth technique, such as chemical vapor deposition (CVD), if necessary.

A SOI type semiconductor device of the type described above is also referred to as a dielectrically isolated integrated circuit. If the insulating layer and the single crystalline layer thereon are formed on a substrate wherein transistors or diodes are fabricated in advance, a three-dimensional integrated circuit is possible. The three-dimensional structure can be extended further, if another stack of an insulating layer and semiconductor single crystalline layers is formed on the present stack of the insulating layer and the single crystalline layers.

Various methods and results of fabricating such semiconductor single crystalline layers and prototype SOI semiconductor devices, including three-dimensional integrated circuits, have been disclosed in several reports. Such reports include "Recrystallization of Si on Amorphous Substrates by Doughnut-Shaped Cw Ar Laser Beam" by S. Kawamura et al., Appl. Phys. Lett. 40(5), 1 Mar. 1982, and "Three-Dimensional CMOS IC's Fabricated by Using Beam Recrystallization" by S. Kawamura et al., IEEE ED Letters, Vol. EDL-4, No. 10, Oct. 1983.

As in the ordinary bipolar integrated circuits directly formed on a silicon substrate, a highly doped buried layer to reduce collector resistivity is required and provided for the transistor in the SOI type semiconductor device using general bipolar technology. The buried layer is formed in the original single crystalline layer (i.e., the recrystallized layer), and the functional device, such as the transistor, is fabricated in the epitaxial layer grown on the recrystallized layer. There has been no disclosure concerning the fabrication of the buried layer of a SOI type semiconductor device because the prior art SOI type bipolar semiconductor devices are based mainly on a so-called lateral bipolar technology, wherein the resistivity of the collector region is not a serious problem. For example, see "Fully Isolated Lateral Bipolar-MOS Transistors Fabricated in Zone-Melting-Recrystallized Si Films on SiO$_2$" by B-Y. Tsaur et al., IEEE ED Letters, Vol. EDL-4, No. 8, Aug. 1983.

SUMMARY OF THE INVENTION

Therefore, it is a primary object of the present invention to provide a SOI type semiconductor device comprising a bipolar transistor with a buried layer.

It is another object of the present invention to provide a novel method for forming a connection to the buried layer of a bipolar transistor of a SOI type semiconductor device.

The above objects can be accomplished by fabricating a SOI type semiconductor device according to the method comprising the steps of forming a single crystalline island on an insulating layer formed on a substrate, the single crystalline island being provided with a single conductivity type and used as a buried layer; forming an epitaxial layer on the single crystalline island; forming tentatively-exposed side surface(s) of the epitaxial layer; and forming a conduction path at the exposed side surface(s), the conduction path extending from the upper surface of the epitaxial layer to the single crystalline island thereunder.

One preferred method step for forming the tentatively-exposed side surface(s) of the epitaxial layer is to remove the polycrystalline layer formed around the epitaxial layer during the process of the epitaxial growth, and another preferred method step is to provide an epitaxial layer with a groove at its peripheral area. One preferred method step for forming the conduction path at the tentatively-exposed side surface(s) is to dope with impurities the exposed side surface(s) with the same conduction type as that of the buried layer, and another preferred method step is to fill the groove with a polycrystalline material doped with similar impurities.

These and other objects, features and advantages of the present invention will become more apparent by reference to the following detailed description of the embodiments and the accompanying drawings.

DETAILED DESCRIPTION OF THE PREFERRED EMBODIMENTS

In the following embodiments, essential parts of the SOI type semiconductor device fabricated in accordance with the present invention are described to be formed from silicon or polysilicon. Some of these parts, however, may be formed from other materials and it is intended that they fall within the scope of the accompanying claims.

FIGS. 1A to 1K are schematic cross-sectional views of a SOI type semiconductor device at different manufacturing steps of the fabricating method according to the present invention.

Figure 1A:
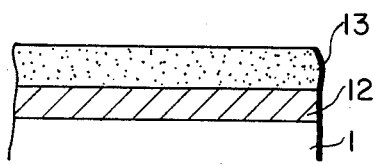
FIGS. 1A to 1K are partial schematic cross-sectional views of a SOI semiconductor device during different steps of the fabricating method in accordance with an embodiment of the present invention.

In the first step, and as shown in FIG. 1A, a polysilicon layer 13, for example, having a thickness of about 1 to 3 microns is deposited on the surface of an insulating layer 12 which is formed on a substrate 1. The substrate 1, for example, is a silicon wafer.

An exemplary method for forming the polysilicon layer 13 is by chemical vapor deposition (CVD). The insulating layer 12 may be a silicon dioxide ($SiO_2$) layer formed by the oxidation of the substrate 1 if the substrate is composed of silicon, or may be a silicon dioxide ($SiO_2$) layer deposited on the substrate 1 by using conventional thin film technology. The thickness of the insulating layer 12 is 0.5 microns, for example.

Figure 1B:
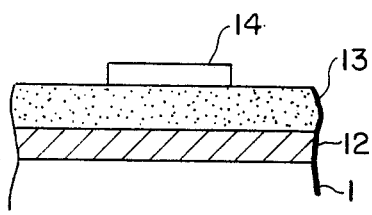

Next, and as shown in FIG. 1B, the surface of the polysilicon layer 13 is selectively masked by a layer 14, such as a silicon nitride ($Si_3N_4$) layer. The selective masking is performed firstly by depositing the layer 14 on the entire surface of the polysilicon layer 13, then patterning the layer 14 so that only the predetermined portion (device region) of the polysilicon layer 13 is masked by the layer 14. The device region has the dimensions of 8 microns in width and 20 microns in length, for example.

Figure 1C:
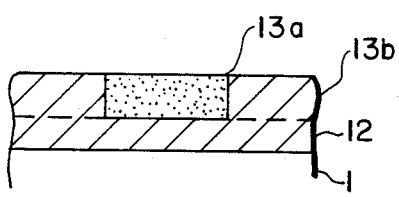

Following the above steps, and as shown in FIG. 1C, the exposed portion of the polysilicon layer 13 is passivated, for example, by using a conventional thermal oxidation process, and then the masking layer 14 is removed. That portion 13a of the previous polysilicon layer 13, which had been kept from the passivation by the masking layer 14, remains as polysilicon. Removing the layer 14 is usually carried out by using a chemical process. Therefore, the masking layer 14 should be formed from a material like $Si_3N_4$ which can more easily be removed by a chemical reagent than that passivated portion 13b of the polysilicon layer, for example a $SiO_2$ layer. If both the insulating layer 12 and the passivated polysilicon layer 13b are composed of $SiO_2$, the polysilicon layer 13a is surrounded by a homogeneous insulating matrix layer 12a (FIG. 1D).

Figure 1D:
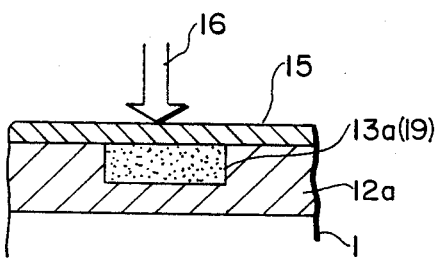

As shown in FIG. 1D, the entire surfaces of the insulating matrix layer 12a and polysilicon layer 13a are coated with an antimonysilicate glass (Sb-SG) layer 15, for example. The Sb-SG layer 15 acts as a source of an impurity to be implanted in the layer 13a. The surface of the Sb-SG layer 15 is irradiated by an energy beam 16, a scanned Cw Ar laser beam, for example, having energy density just enough to melt the polysilicon layer 13a. Since the Sb-SG layer 15 is transparent to the laser beam 16, the polysilicon layer 13a is heated up and then recrystallized into a single crystalline layer (19) (FIG. 1D). In this heating, the single crystalline layer (19) is provided with n-type conduction capability, due to the antimony atoms diffused from the Sb-SG layer 15. Thus, a single crystalline layer of silicon, which is like an island embedded in an insulating matrix layer 12a, is formed. A plurality of such islands of single crystalline layer 19 are formed generally in rows and columns on the substrate 1.

Figure 1E:
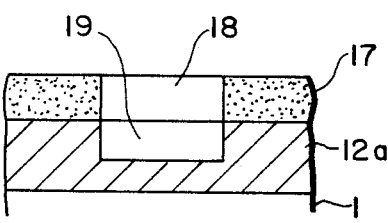

The substrate 1 with the single crystalline island 19 then is subjected to an epitaxial growth process using a low temperature CVD at 1000° C., for example. Thus, and as shown in FIG. 1E, an epitaxial silicon layer 18 is formed on the single crystalline island 19, while a polysilicon layer 17 is formed on the insulating matrix layer 12a. The thickness of the layers 17 and 18 is generally in the range of from 2 to 10 microns, preferably about 8 microns.

Following the above epitaxial growth process, the substrate 1 with the polysilicon layer 17 and epitaxial layer 18 is subjected to the process for tentatively exposing side surface(s) of the epitaxial layer 18. The process is carried out according to the steps described below.

Figure 1F:
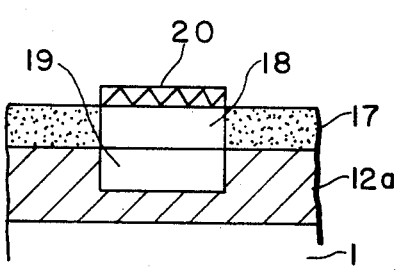
Figure 1G:
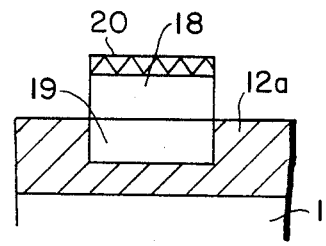

As shown in FIG. 1F, the upper surface of the epitaxial layer 18 is selectively masked by a layer 20. The masking layer 20 of $Si_3N_4$, for example, is formed by using a conventional thin film technology and patterned by using a conventional photolithographic technique. Then, and as shown in FIG. 1G, the polysilicon layer 17 around the epitaxial layer 18 protected by the masking layer 20 is selectively removed by using a chemcial reagent. Thus, the side surface(s) of the epitaxial layer 18 are exposed. If the epitaxial layer 18 has a round shape, the exposed side surface is cylindrical. If the epitaxial layer 18 has a rectangular shape, there are multiple exposed side surfaces.

Figure 1H:
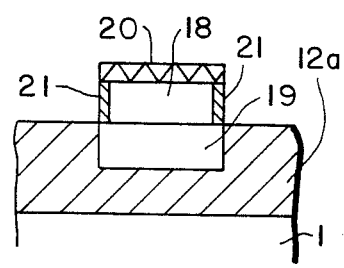

A process for forming a conduction path at the exposed side surface(s) of layer 18 is subsequently performed by introducing a single conductivity type impurity to the exposed side surface(s). In this process, the masking layer 20 protects the upper surface of the epitaxial layer 18 from the doping of the impurity. An exemplary method for the conduction path forming process is diffusion of an impurity gas at low temperature. An impurity source gas, such as phosphorus tribromide ($PBr_3$) or phosphorus oxytrichloride ($POCl_3$), is generated by conducting a carrier gas like nitrogen into a solution of the impurity source gas. The solution is heated at about 40° C. and introduced into a reaction chamber. In the reaction chamber, the substrate with the epitaxial layer whose side surface(s) is exposed is heated at a temperature of about 900° to 950° C. in the atmosphere of the impurity source gas. By contacting the exposed side surface(s) of the epitaxial layer, the above impurity source gas is decomposed to liberate the phosphorus molecules, the phosphorus atoms from the molecules diffusing into the side surface(s). Thus, and as shown in FIG. 1H, an n-type conduction path 21 having a thickness of about 0.5 to 1 micron is formed at the side surface(s) of the epitaxial layer 18.

Figure 1I:
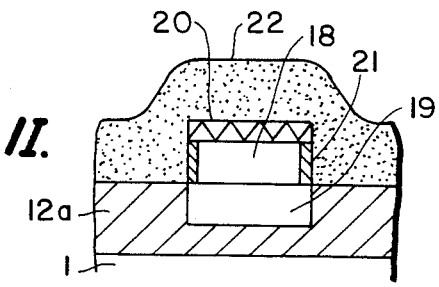
Figure 1J:
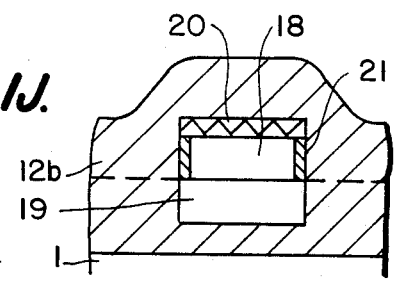

Following the above process, and as shown in FIG. 1I, a polycrystalline layer 22, for example a polysilicon layer having a thickness equal to or more than that of the epitaxial layer 18, is deposited on the entire surface of the substrate 1 having the epitaxial layer 18 and insulating matrix layer 12a. For forming a polysilicon layer as the layer 22, a conventional method can be used such as low temperature CVD at 650° C. Then, and as shown in FIG. 1J, the polycrystalline layer 22 formed from polysilicon, for example, is entirely passivated by using an appropriate technique such as thermal oxidation at 900° C. In the above process, it is not requisite to remove the masking layer 20 prior to the forming of the polycrystalline layer 22.

Of course, the step shown in FIG. 1I can be omitted if an insulating layer, such as $SiO_2$, is deposited directly on the surface of the substrate 1 by means of a conventional CVD, for example, instead of the polycrystalline layer 22. Such a CVD process for forming a $SiO_2$ layer can be performed at a temperature in the range of from 650° to 800° C.

Figure 1K:
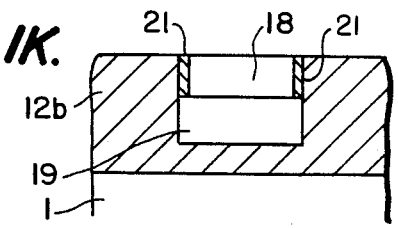

As shown in FIG. 1K, the surface of the passivated polycrystalline layer 22 then is reduced, for example by a mechanical polishing technique, until the upper surface of the epitaxial layer is just exposed. Thus, the conduction path formed from the n-type impurity diffusion layer 21 at the side surface(s) of the epitaxial layer 18 is also exposed and can be used as the connection to the original single crystalline island layer 19.

Where the insulating matrix layer 12a (see FIG. 1D to FIG. 1I) and the passivated polycrystalline layer 22 are composed of the same material, a single crystalline layer is formed as shown in FIG. 1J and the single crystalline island layer 19 and the epitaxial layer 18 become embedded in a homogeneous insulating matrix 12b as shown in FIG. 1K.

Figure 3A:
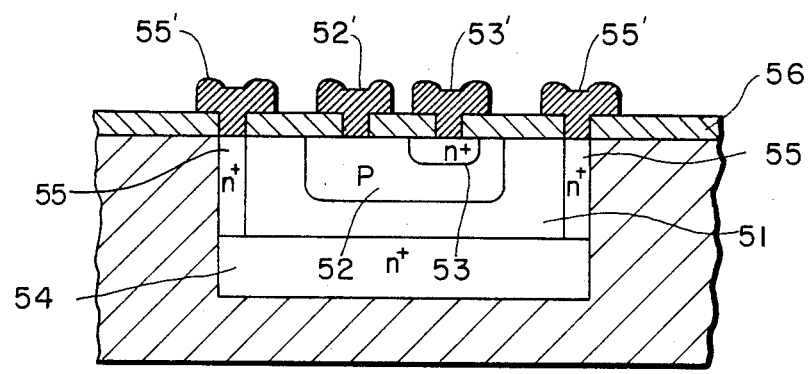
FIGS. 3A and 3B are respectively a partial schematic cross-sectional view and a plan view of a SOI type semiconductor device fabricated according to the present invention.
Figure 3B:
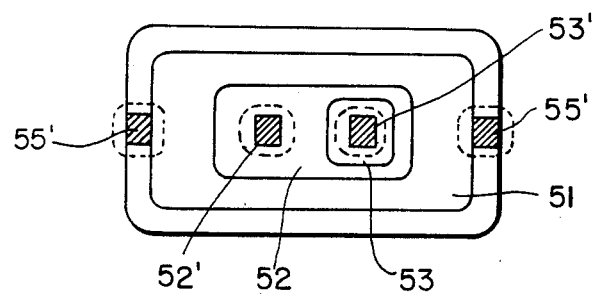

Subsequent to the above processes, a functional device is formed, such as a transistor shown in FIGS. 3A and 3B. FIGS. 3A and 3B are respectively a partial schematic cross-sectional view and plan view of the SOI semiconductor device. Referring to FIGS. 3A and 3B, a transistor comprising collector region 51, base region 52 and emitter region 53 is formed in the epitaxial layer 18. The original single crystalline island 19, which is highly doped with antimony as an n-type impurity, constitutes an n+ buried layer 54 and the impurity diffusion layer 21 constitutes a connection 55 to the buried layer 54. The n-type collector region 51 is formed by voluntary diffusion of the n-type impurity from the n+ buried layer 54, while the p-type base region 52 and n+ emitter region 53 are formed by diffusing or ion implanting of relevant impurities as in the fabrication of ordinary bipolar transistors. These regions 52 and 53 and the connection 55 are provided with corresponding terminal contacts 52′, 53′ and 55′ through an insulating film 56 covering the surface of the transistor. Each of the contacts is composed of a metallic aluminum layer, for example.

The above embodiment enjoys the advantage of a self-alignment provided by using the masking layer 20 during both the process for forming the tentatively-exposed side surface(s) of the epitaxial layer 18 and the process for forming the conduction path 21 at the side surface(s).

FIGS. 2A to 2G are schematic cross-sectional views showing a SOI semiconductor device during different steps of the fabricating method in accordance with another embodiment of the present invention. In this embodiment, the tentatively-exposed side surface(s) of the epitaxial layer are formed by providing a groove at its peripheral area.

Figure 2A:
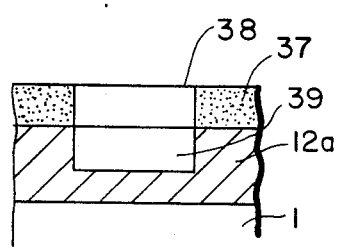
FIGS. 2A to 2G are partial schematic cross-sectional views of a SOI semiconductor device during different steps of the fabricating method in accordance with another embodiment of the present invention.

Referring to FIG. 2A, an epitaxial layer 38 is grown on a single crystalline island 39, while a polycrystalline layer 37, which is grown together with the epitaxial layer 38, is formed on the insulating layer 12a supported by the substrate 1. The method for obtaining the above structure and its dimensions are similar to those described in the previous embodiment.

Figure 2E:
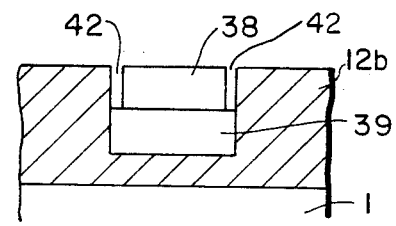
Figure 2B:
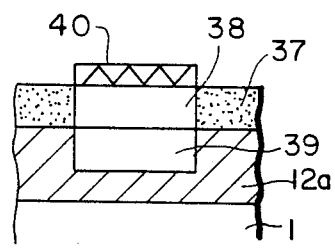

As shown in FIG. 2B, the surface of the epitaxial layer 38 is selectively masked by a layer 40 which is resistant to the treatment in the subsequent passivation step. Then, the exposed polycrystalline layer 37 is passivated by using a conventional thermal oxidation at 900° C., for example. Thus, and as shown in FIG. 2C, the single crystalline layer comprising the single crystalline island 39 and epitaxial layer 38 is embedded in a homogeneous insulating matrix layer 12b, if the passivated polycrystalline layer 37 is formed of the same material as that of the insulating layer 12a. The masking layer 40 is removed prior to the following grooving step.

If the polycrystalline layer 37 is converted into $SiO_2$, $Si_3N_4$ is particularly suitable for the masking layer 40. This is because the $Si_3N_4$ masking layer 40 can be patterned without affecting the polysilicon layer 37 before the passivation and can be preferentially removed without using any protective masking for the passivated polysilicon layer. As shown in FIG. 2D, the surface of the epitaxial layer 38 is masked again by a photoresist layer 41 so that its peripheral area is left unmasked by the width of about 1.5 to 2 microns. Then, as shown in FIG. 2E, a groove 42 is formed at the unmasked peripheral area, by using a conventional chemical etching technique, to a depth reaching the underlying single crystalline island layer 39. The etching may be carried out until the total thicknesses of the epitaxial layer 38 and the original single crystalline island layer 39 at the peripheral area are etched off. By doing so, process control for the etching can be facilitated.

Figure 2F:
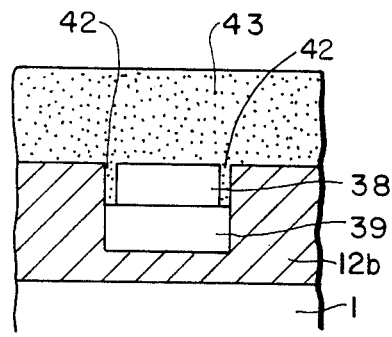
Figure 2C:
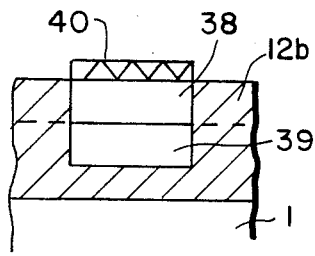

Following the above process for forming the tentatively-exposed side surface(s) of the epitaxial layer 38, and as shown in FIG. 2F, a polycrystalline layer 43, for example a polysilicon layer, is deposited on the entire surface of the substrate 1 bearing the epitaxial layer 38. This deposition can be provided using a conventional low temperature CVD at 650° C. The polysilicon layer 43 is formed to have a thickness larger than the depth of the groove 42, and is doped with an impurity providing n-type conduction in a manner similar to single crystalline island layer 39. Thus, that part of the polycrystalline layer 43 filling the groove 42 constitutes a conduction path to the single crystalline island layer 39 underlying the epitaxial layer 38.

Figure 2G:
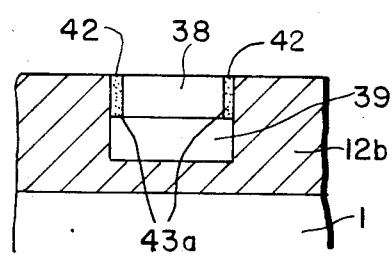
Figure 2D:
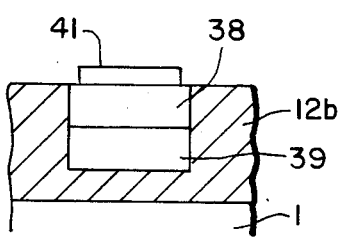

Then, as shown in FIG. 2G, the polycrystalline layer 43 is reduced, for example by a mechanical polishing technique, until the upper surface of the epitaxial layer 39 is exposed. Thus, a conduction path 43a is formed that can be used as the connection to the single crystalline island layer 39.

Subsequent to the above processes, a functional device is formed as already explained in the description of the previous embodiment with reference to the transistor shown in FIGS. 3A and 3B. In FIGS. 3A and 3B, the transistor comprising the collector region 51, base region 52 and emitter region 53 is formed in the epitaxial layer 38. The original single crystalline island layer 39 constitutes the n+ buried layer 54 and the polycrystalline layer 43a constitutes the connection 55 to the buried layer 54.

Thus, in the structural arrangement of the SOI type semiconductor device, the present invention provides a connection to the buried layer of a bipolar transistor with the connection having the following advantageous features:

(1) fabricated without using a deep vertical diffusion into an epitaxial layer;

(2) fabricated regardless of the thickness of the epitaxial layer; and (3) fabricated by using processes at a temperature lower than 1,000° C.

Therefore, the present invention is particularly useful in the fabrication of the bipolar ICs for such applications as operational amplifiers and so forth. In such cases, transistors need breakdown voltages of ten to hundred volts and epitaxial layers of a thickness of ten microns. In the past, such transistors have required fabrication using a deep vertical diffusion at a temperature higher than 1,200° C. to form the connection to the buried layer thereunder.

The many features and advantages of the present invention are apparent from the detailed description, but it will be recognized by those skilled in the art that modifications and variations may be effected within the spirit and scope of the present invention. For example, in the above embodiments, a Sb-SG layer is used for the source of the impurities which are doped into the single crystalline island. However, an ion-implantation technique alternatively could be used for the impurity doping to the single crystalline island layer which has been recrystallized by using a laser beam without the coating of the Sb-SG layer.

I claim:
1. A method for fabricating a SOI (Semiconductor on Insulator) type semiconductor device, comprising the steps of:
(a) forming a single crystalline island on an insulating layer formed on a substrate, the single crystalline island having one conductivity type;
(b) forming an epitaxial layer on the single crystalline island;
(c) forming a tentatively-exposed side surface of the epitaxial layer; and
(d) forming a conduction path at the exposed side surface, the conduction path extending from the upper surface of the epitaxial layer to the single crystalline island thereunder.
2. A method for fabricating a SOI type semiconductor device as set forth in claim 1, wherein the substrate is a silicon substrate.
3. A method for fabricating a SOI type semiconductor device as set forth in claim 2, wherein said step (a) includes forming the insulating layer by oxidation of the silicon substrate.
4. A method for fabricating a SOI type semiconductor device as set forth in claim 1, wherein the insulating layer is composed of silicon dioxide.
5. A method for fabricating a SOI type semiconductor device as set forth in claim 1, wherein said step (a) of forming a single crystalline island includes the substeps of:
forming a first polycrystalline layer on the insulating layer;
selectively passivating the first polycrystalline layer except for the portion in which the single crystalline island is to be formed;
coating the surface of the first polycrystalline layer, after the selectively passivating substep, with a layer which is the source of the dopant for providing the island portion of the first polycrystalline layer with the one conductivity type;
heating for recrystallizing the first polycrystalline layer at the island portion and for diffusing the dopant into the first polycrystalline layer at the island portion; and
removing the coating layer after said heating substep.

6. A method for fabricating a SOI type semiconductor device as set forth in claim 5, wherein said heating substep is performed by the irradiation of an energy beam.
7. A method for fabricating a SOI type semiconductor device as set forth in claim 6, wherein the energy beam is a laser beam.
8. A method for fabricating a SOI type semiconductor device as set forth in claim 5, wherein the first polycrystalline layer is formed from a material which can result in the same substance as the insulating layer when passivated.
9. A method for fabricating a SOI type semiconductor device as set forth in claim 5, wherein the first polycrystalline layer is a polysilicon layer.
10. A method for fabricating a SOI type semiconductor device as set forth in claim 9, wherein said substep of selectively passivating is performed by oxidation.
11. A method for fabricating a SOI type semiconductor device as set forth in claim 5, wherein the coating layer is formed from an antimony-silicate grass (Sb-SG).
12. A method for fabricating a SOI type semiconductor device as set forth in claim 5, wherein the epitaxial layer is formed from the same material as the first polycrystalline layer.
13. A method for fabricating a SOI type semiconductor device as set forth in claim 1, wherein the epitaxial layer is formed of silicon.
14. A method for fabricating a SOI type semiconductor device as set forth in claim 1, wherein said step (b) of forming an epitaxial layer includes the substep of forming a first polycrystalline layer around the epitaxial layer and said step (c) of forming the tentatively-exposed side surface of the epitaxial layer includes the substeps of:
forming a mask layer on the surface of the epitaxial layer; and
removing the first polycrystalline layer which has been formed around the epitaxial layer during said step (b) of forming the epitaxial layer.
15. A method for fabricating a SOI type semiconductor device as set forth in claim 14, wherein said step (d) of forming the conduction path at the tentatively-exposed side surface of the epitaxial layer comprises introducing one conductivity type impurity to the side surface of the epitaxial layer having the mask layer.
16. A method for fabricating a SOI type semiconductor device as set forth in claim 14, wherein said step (d) of forming the conduction path includes the substeps of:
forming a conduction path at the exposed side surface of the epitaxial layer after the substep of removing the first polycrystalline layer around the epitaxial layer;
forming a second polycrystalline layer on the surface of the insulating layer and around the epitaxial layer with the conduction path;
passivating the second polycrystalline layer; and
exposing the upper surface of the epitaxial layer after the substep of passivating the second polycrystalline layer.
17. A method for fabricating a SOI type semiconductor device as set forth in claim 16, wherein the second polycrystalline layer is formed from the same material as that forming the single crystalline island.
18. A method for fabricating a SOI type semiconductor device as set forth in claim 16, wherein the second polycrystalline layer is a polysilicon layer.
19. A method for fabricating a SOI type semiconductor device as set forth in claim 18, wherein the substep of passivating the second polycrystalline layer comprises passivating the polysilicon layer by oxidation.

20. A method for fabricating a SOI type semiconductor device as set forth in claim 16, wherein the substep of exposing the upper surface of the epitaxial layer is performed by mechanical polishing.

21. A method for fabricating a SOI type semiconductor device as set forth in claim 16, wherein in the substep of exposing the upper surface of the epitaxial layer, the upper surface is leveled to the surface of the passivated second polycrystalline layer around the epitaxial layer.

22. A method for fabricating a SOI type semiconductor device as set forth in claim 1, wherein said step (b) of forming an epitaxial layer includes the substep of forming a first polycrystalline layer around the epitaxial layer and said step (c) of forming the tentatively-exposed side surface of the epitaxial layer includes the substeps of:
forming a first mask layer on the surface of the epitaxial layer by a first resist layer;
passivating the first polycrystalline layer which has been formed around the epitaxial layer during said step (b) of forming the epitaxial layer;
removing the first mask layer;
selectively forming a second mask layer on the surface of the epitaxial layer so that the peripheral area of the surface is exposed; and
forming a groove in the peripheral area, the groove having a depth equal to or larger than the thickness of the epitaxial layer.

23. A method for fabricating a SOI type semiconductor device as set forth in claim 22, wherein said step (d) of forming the conduction path at the tentatively-exposed side surface of the epitaxial layer comprises forming a second polycrystalline layer on the surface of the first polycrystalline layer and the epitaxial layer so that the groove formed in the peripheral area of the epitaxial layer is filled with the second polycrystalline layer, the second polycrystalline layer having one conductivity type impurity.

24. A method for fabricating a SOI type semiconductor device as set forth in claim 23, wherein the second polycrystalline layer is formed from the same material as that forming the single crystalline island.

25. A method for fabricating a SOI type semiconductor device as set forth in claim 23, wherein the second polycrystalline layer is a polysilicon layer.

26. A method for fabricating a SOI type semiconductor device as set forth in claim 23, wherein said step (d) of forming the conduction path includes a substep of exposing the upper surface of the epitaxial layer after forming the second polycrystalline layer.

27. A method for fabricating a SOI type semiconductor device as set forth in claim 26, wherein said substep of exposing the upper surface of said epitaxial layer is performed by mechanical polishing.

28. A method for fabricating a SOI type semiconductor device as set forth in claim 26, wherein in said substep of exposing the upper surface of the epitaxial layer, the upper surface of the epitaxial layer is leveled to the surface of the passivated first polycrystalline layer around the epitaxial layer.

* * * * *